(12) United States Patent
Law et al.

(10) Patent No.: US 8,587,123 B2
(45) Date of Patent: Nov. 19, 2013

(54) MULTI-CHIP AND MULTI-SUBSTRATE RECONSTITUTION BASED PACKAGING

(75) Inventors: Edward Law, Ladera Ranch, CA (US); Kevin (Kunzhong) Hu, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/246,465

(22) Filed: Sep. 27, 2011

(65) Prior Publication Data

US 2013/0075917 A1 Mar. 28, 2013

(51) Int. Cl.
*H01L 23/48* (2006.01)

(52) U.S. Cl.
USPC ........... 257/773; 257/776; 257/777; 257/778; 257/E25.03; 257/E23.172; 257/E23.141; 257/E23.169

(58) Field of Classification Search
USPC .................. 257/685, 778, E23.003, E23.007, 257/E23.016, E23.063, E23.169, E25.03, 257/E27.161, E27.144, E27.137, E25.005, 257/E25.011, E25.015, E25.016, E25.026, 257/698, 777, 773, 723, E23.019, E23.177; 438/109

See application file for complete search history.

(56) References Cited

U.S. PATENT DOCUMENTS

| | | | |
|---|---|---|---|
| 6,882,056 B2 * | 4/2005 | Komiyama et al. | 257/777 |
| 8,110,908 B2 * | 2/2012 | Kim et al. | 257/686 |
| 8,120,187 B2 * | 2/2012 | Dahilig et al. | 257/777 |

* cited by examiner

*Primary Examiner* — Jasmine Clark
(74) *Attorney, Agent, or Firm* — Sterne, Kessler, Goldstein & Fox P.L.L.C.

(57) ABSTRACT

Embodiments for multi-chip and multi-substrate reconstitution based packaging are provided. Example packages are formed using substrates from a reconstitution. substrate panel or strip. The reconstitution substrate panel or strip may include known good substrates of same or different material types and/or same of different layer counts and sizes. As such, different combinations of reconstitution substrates and chips can be used within the same package, thereby allowing substrate customization according to semiconductor chip block(s) and types contained in the package.

20 Claims, 9 Drawing Sheets

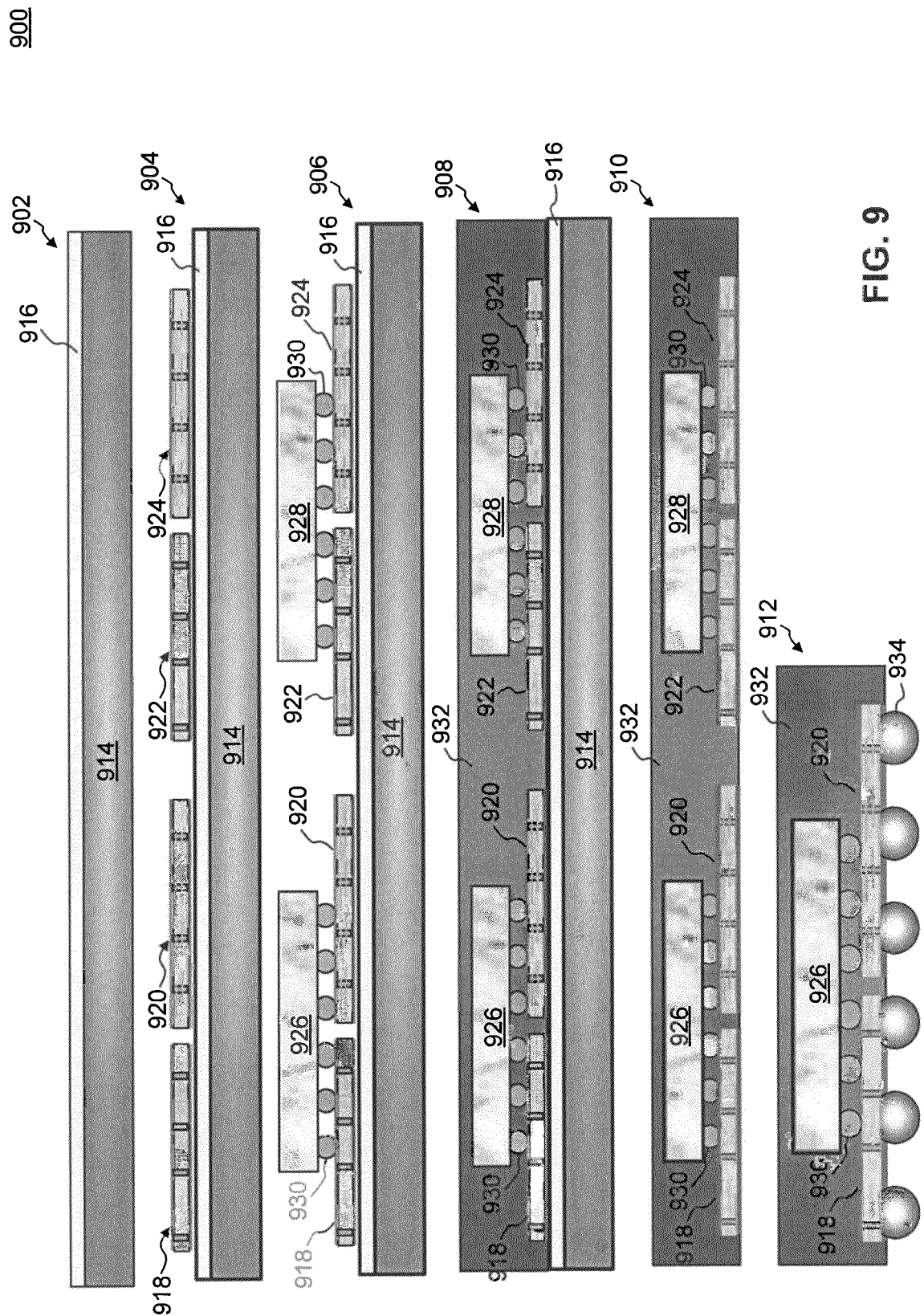

MULTI-CHIP AND MULTI-SUBSTRATE RECONSTITUTION BASED PACKAGING

BACKGROUND

1. Field of the Invention

The present invention relates generally to reconstitution based packaging solutions.

2. Background Art

Integrated circuit (IC) chips or dies are typically interfaced with other circuits using a package that can be attached to the printed circuit board (PCB). Example package types include ball grid array (BGA) or land grid array (LGA) packages. One type of BGA or LGA package has one or more IC dies attached to a first surface of a package substrate, and an array of solder balls or land pads located on a second surface of the package substrate.

The complexity of a package depends upon the functionality requirements of the package. For example, in some cases, the package may enclose multiple integrated circuits to form a system-in-a-package (SiP). Also, the package substrate may include a single or multiple conductive layers, laminated together with dielectric material.

The package substrate is typically manufactured in a panel format. The panel is cut into individual substrate pieces as desired during package construction. Individual substrates are then tested and faulty substrates are discarded. Individual substrates that are known to be good ("known-good") are used in package fabrication with integrated circuits (ICs).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 9 illustrates a process for fabricating an example package according to an embodiment of the present invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

The complexity of a package substrate is based upon the signal complexity and pinout requirements of each specific section of integrated circuit supported by the package substrate. Package substrate layer count, material selection, and design rules are strongly related to the complexity of the package substrate. Existing IC packaging solutions are primarily focused on using a single or multiple dies in a package substrate format.

Embodiments of the present invention, as further described below, provide a multi-chip and multi-substrate approach, which can be adopted to further optimize circuit layout density, cost, and performance. Embodiments of the present invention rely on reconstituted substrate panels/strips formed from individual substrates, obtained from a conventional substrate manufacturing process. As such, existing equipment can be leveraged with minimal change in the manufacturing process flow. The reconstituted substrate panels/strips are referred to hereinafter as reconstitution substrate panels/strips. The individual substrates that form a reconstitution substrate panel/strip are referred to as individual reconstitution substrates. As further described below, reconstitution substrate panels/strips enable a variety of packaging options which can be cost and performance optimized according to the particular application(s) being implemented in the package.

Figure 1:
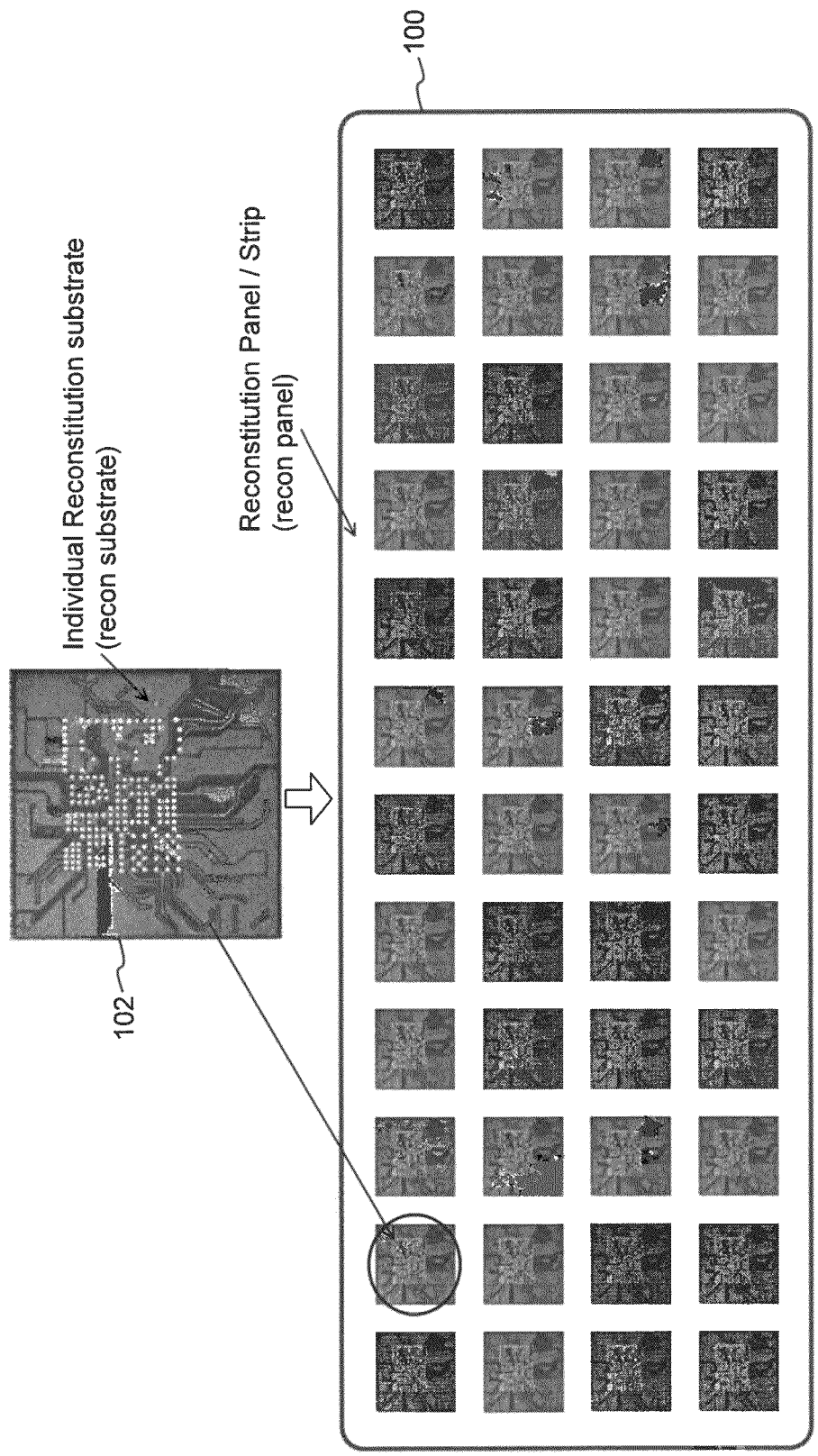
FIG. 1 illustrates the forming of an example reconstitution substrate panel from individual reconstitution substrates according to an embodiment of the present invention.

FIG. 1 illustrates the forming of an example reconstitution substrate panel 100 from individual reconstitution substrates 102 according to an embodiment of the present invention. Individual reconstitution substrates 102 are "known good" substrates and can have same or different material types and sizes, and same or different layer counts, for example. In embodiments, individual reconstitution substrates 102 are selected and assembled on panel 100 based on the particular package(s) to be formed using reconstitution substrate panel 100. The packages (which may be identical or different) can then be formed on respective regions of the reconstitution substrate panel 100. As further described below, reconstitution substrate panel 100 enables different combinations of reconstitution substrates to used within the same package, thereby allowing substrate customization according to the particular circuit block(s) or the particular IC(s) contained in the package. Further, because reconstitution substrate panel 100 uses only known good substrates, assembly line efficiency is improved.

Example packages, according to embodiments, formed using individual reconstitution substrates from a reconstitution panel or strip are described below. These examples are provided for the purpose of illustration only, and are not limiting to embodiments of the present invention. For example, embodiments according to the present invention may combine features of any of the examples to result in packages other than described below.

Figure 2:
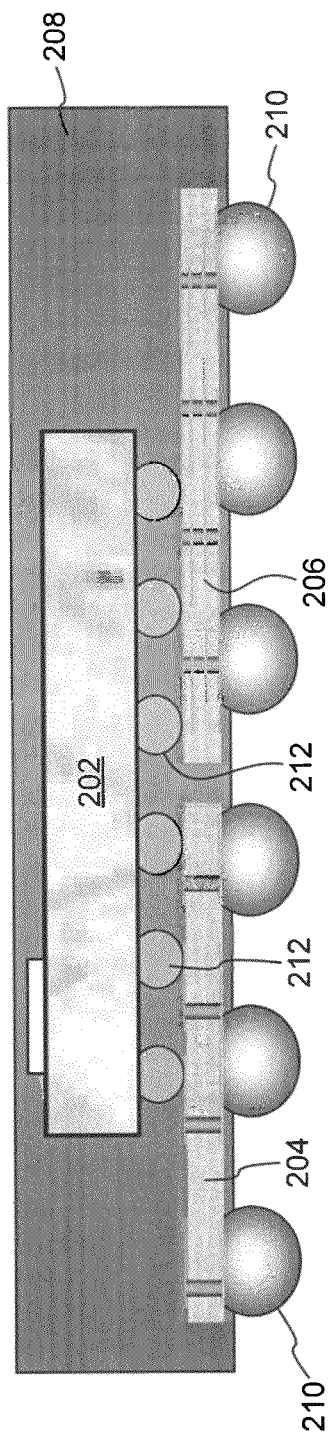
FIG. 2 illustrates a cross-sectional view of an example package according to an embodiment of the present invention.

FIG. 2 illustrates a cross-sectional view of an example package 200 according to an embodiment of the present invention. Example package 200 may be a fine-pitch ball grid array (FBGA) or a land grid array (LGA) package.

As shown in FIG. 2, example package 200 includes a semiconductor chip or die 202, a first substrate 204, and a second substrate 206, all sealed by a molding compound or encapsulate 208 (e.g., an epoxy mold compound (EMC)), so as to present a single integrated package to the outside world.

Semiconductor chip 202 is interconnected to first substrate 204 and second substrate 206. In an embodiment, as shown in FIG. 2, chip 202 is a flip-chip and is interconnected to a first surface of first substrate 204 and/or a first surface of second substrate 206 via a plurality of respective solder/stud bumps or copper pillar bumps 212, deposited on respective chip pads (not shown in FIG. 2) of chip 202 or on respective substrate pads of substrates 204 and 206. Alternatively, chip 202 is interconnected to the first surface of first substrate 204 and/or the first surface of second substrate 206 via respective wire bonds or similar connections.

First substrate 204 and second substrate 206 each includes a second surface upon which a respective plurality of solder balls (e.g., ball grid array (BGA) balls) 210 may be attached. Solder balls 210 serve as external connection terminals.

In an embodiment, first substrate 204 and second substrate 206 are reconstitution substrates from a reconstitution panel or strip. As such, first substrate 204 and second substrate 206 may be of same or different types of material. For example, each of first substrate 204 and second substrate 206 can be made of, for example and without limitation, flex tape material, ceramic material, organic laminate material, resin-based material, lead frame or other similar materials. According to embodiments, first substrate 204 is characterized by a first material type and second substrate 206 is characterized by a second material type.

Further, first substrate 204 and second substrate 206 may have same or different layer counts (e.g., metal layer counts). The layer counts of first substrate 204 and second substrate 206 can be any number, as desired. According to embodiments, first substrate 204 is characterized by a first layer count and second substrate 206 is characterized by a second layer count. Further, first substrate 204 and second substrate 206 may have same or different size.

According to embodiments, one or more of the first material type, the first layer count, the second material type, and the second layer count are customized according to characteristics of chip 202. For example, the first layer count and/or the first material type of first substrate 204 may be selected according to characteristics of a first portion of chip 202 (e.g., properties and/or performance requirements of circuit blocks implemented over the first portion) that interconnects to first substrate 204. Similarly, the second layer count and/or the second material type of second substrate 206 may be selected according to characteristics of a second portion of chip 202 that interconnects to second substrate 206. In FIG. 2, the first portion and the second portion of chip 202 are not shown; however, they may be defined in any manner according to embodiments.

In an example embodiment, the first portion of chip 202 includes radio frequency (RF) circuit blocks, which require high signal integrity, high operating power blocks, which impose high heat dissipation requirements, and/or fine bump pitch blocks, which require fine pitch substrate design. The second portion of chip 202, on the other hand, includes circuit blocks which do not require high signal integrity, high heat dissipation, and/or fine pitch requirements. Accordingly, first substrate 204 may be selected to have a fine pitch, high layer count with increased thermal vias in order to satisfy the high signal integrity, high heat dissipation, and/or fine pitch requirements of the first portion of chip 202. In contrast, second substrate 206 may be selected to be an inexpensive substrate with low layer count (e.g., single or two layers). As such, embodiments provide both performance-optimized and cost-optimized packaging solutions.

Example package 200 may also include additional semiconductor chips (not shown in FIG. 2) that are also interconnected to first substrate 204 and second substrate 206. For example, additional chips may be stacked vertically on top of chip 202 and interconnected to substrates 204 and 206 via wire bonds or similar connections, for example. Alternatively, or additionally, additional chips may be placed side by side with chip 202 and interconnected to substrates 204 and 206 or other substrate.

Figure 3:
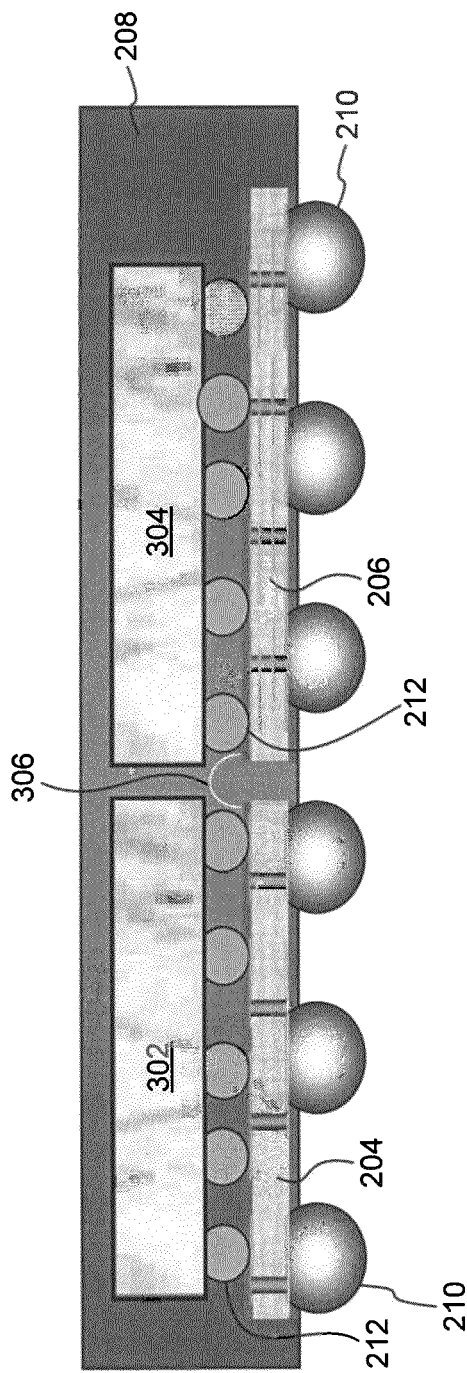
FIG. 3 illustrates a cross-sectional view of an example package according to an embodiment of the present invention.

FIG. 3 illustrates a cross-sectional view of another example package 300 according to an embodiment of the present invention. Example package 300 may be a fine-pitch ball grid array (FBGA) package.

As shown in FIG. 3, example package 300 includes a first semiconductor chip 302, a second semiconductor chip 304, a first substrate 204, and a second substrate 206, all sealed by a molding compound or encapsulate 208 (e.g., an epoxy mold compound (EMC)), so as to present a single integrated package to the outside world.

Semiconductor chips 302 and 304 are interconnected respectively to first substrate 204 and second substrate 206. In an embodiment, as shown in FIG. 3, chips 302 and 304 are flip-chips and are interconnected, respectively, to a first surface of first substrate 204 and a first surface of second substrate 206 via a plurality of respective solder/stud bumps 212, deposited on respective chip pads (not shown in FIG. 3) of chips 302 and 304 or on respective substrate pads of substrate 204 and 206. Alternatively, chips 302 and 304 are interconnected, respectively, to the first surface of first substrate 204 and the first surface of second substrate 206 via respective wire bonds or similar connections.

First substrate 204 and second substrate 206 each includes a second. surface upon which a respective plurality of solder balls (e.g., bail grid array (BGA) balls) 210 may be attached. Solder balls 210 serve as external connection terminals.

As in example package 200 described above, in an embodiment, first substrate 204 and second substrate 206 are reconstitution substrates from a reconstitution panel or strip. As such, first substrate 204 and second substrate 206 may be of same or different types of material. According to embodiments, first substrate 204 is characterized by a first material type and second substrate 206 is characterized by a second material type. Further, first substrate 204 and second substrate 206 may have same or different layer counts. According to embodiments, first substrate 204 is characterized by a first layer count and second substrate 206 is characterized by a second layer count. First substrate 204 and second substrate 206 may have same or different size. First substrate 204 and second substrate 206 may have same or different design rules. Further, first substrate 204 and second substrate 206 may be connected with each other through a wirebond 306 or other similar interconnection.

In embodiments, the first layer count and/or the first material type of first substrate 204 may be selected according to characteristics of chip 302 (e.g., properties and/or performance requirements of circuit blocks implemented in chip 302), which interconnects to first substrate 204. Similarly, the second layer count and/or the second material type of second substrate 206 may be selected according to characteristics of chip 304 (e.g., properties and/or performance requirements of circuit blocks implemented in chip 304), which interconnects to second substrate 206. In embodiments, the characteristics of chip 302 may be different from the characteristics of chip 304.

In embodiments, either of the IC chips 302 and 304 can be connected to multiple individual reconstitution substrates instead of a single substrate. Further, the active surface of chip 304 and the non active surface of chip 302 can be exposed to the ambient instead of embedded in the molding compound 208 for heat dissipation enhancement purpose.

Figure 4:
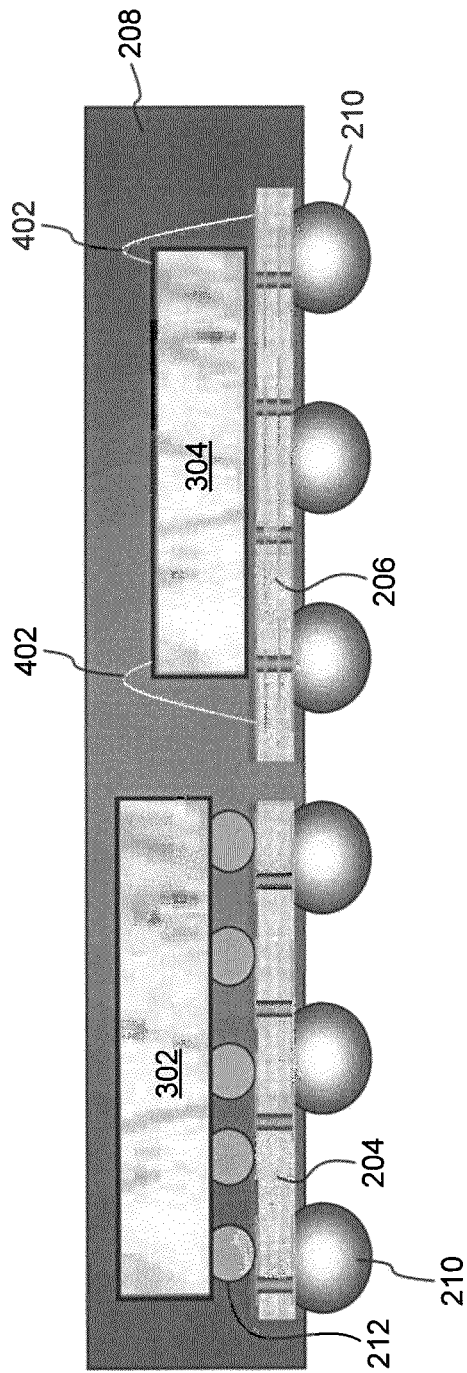
FIG. 4 illustrates a cross-sectional view of an example package according to an embodiment of the present invention.

FIG. 4 illustrates a cross-sectional view of another example package 400 according to an embodiment of the present invention. Example package 400 may be a fine-pitch ball grid array (FBGA) package.

Example package 400 is similar to example package 300 described above in FIG. 3. As such, as shown in FIG. 4, example package 400 includes a first semiconductor chip 302, a second semiconductor chip 304, a first substrate 204, and a second substrate 206, all sealed by a molding compound or encapsulate 208 (e.g., an epoxy mold compound (EMC)), so as to present a single integrated package to the outside world.

Semiconductor chips 302 and 304 are interconnected respectively to first substrate 204 and second substrate 206. In an embodiment, as shown in FIG. 4, chip 302 is a flip-chip and is interconnected to a first surface of first substrate 204 via a plurality of solder/stud bumps 212. In contrast, chip 304 is interconnected to a first surface of second substrate 206 via wire bonds 402 or similar connections. Substrate 204 and substrate 206 can also be connected with each other through wirebonds or similar interconnections.

Thus, example package 400 provides a further layer of package customization by allowing different types of interconnection technologies to be used within the same package. According to embodiments, the choice of interconnection technologies for each of chips 302 and 304 is based, for example, on cost, performance, and/or form factor considerations imposed by the specific application(s) being implemented on each chip. For example, flip-chip bonding may be preferred for applications requiring a small form factor (e.g., consumer electronics) and/or high device speed, or for high-volume applications that benefit from an efficient use of silicon real estate. On the other hand, wire bonding provides flexibility and requires lower cost substrates (flip-chip bonding typically requires higher layer count substrate than wire bonding).

As in example package 200 described above, in an embodiment, first substrate 204 and second substrate 206 are reconstitution substrates from a reconstitution panel or strip. As such, first substrate 204 and second substrate 206 may be of same or different types of material and can have same or different size. According to embodiments, first substrate 204 is characterized by a first material type and second substrate 206 is characterized by a second material type. Further, first substrate 204 and second substrate 206 may have same or different layer counts. According to embodiments, first substrate 204 is characterized by a first layer count and second substrate 206 is characterized by a second layer count.

In embodiments, the first layer count and/or the first material type of first substrate 204 may be selected according to characteristics of chip 302 (e.g., properties and/or performance requirements of circuit blocks implemented in chip 302), which interconnects to first substrate 204. Similarly, the second layer count and/or the second material type of second substrate 206 may be selected according to characteristics of chip 304 (e.g., properties and/or performance requirements of circuit blocks implemented in chip 304), which interconnects to second substrate 206.

Figure 5:
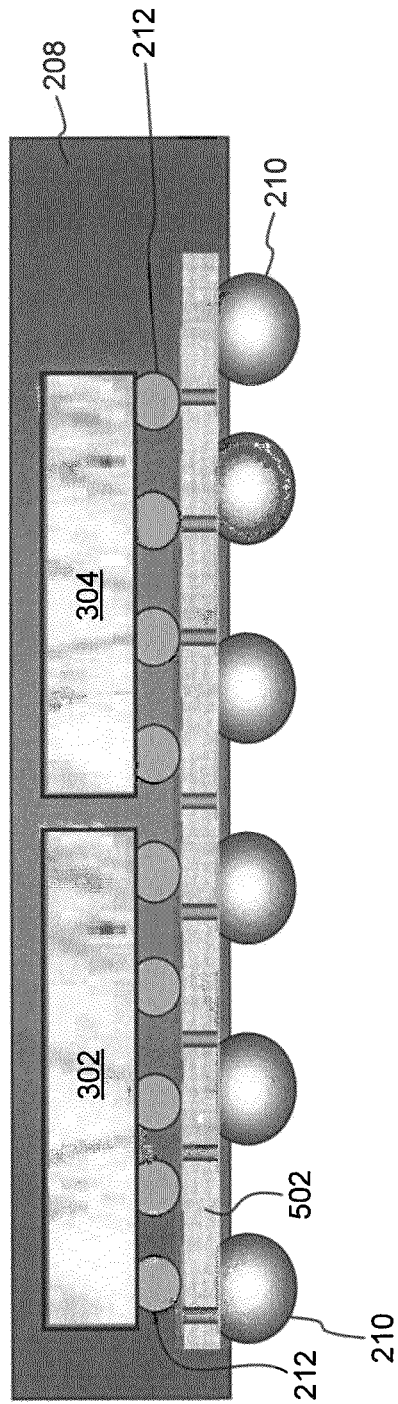
FIG. 5 illustrates a cross-sectional view of an example package according to an embodiment of the present invention.

FIG. 5 illustrates a cross-sectional view of another example package 500 according to an embodiment of the present invention. Example package 500 may be a fine-pitch ball grid array (FBGA) package.

As shown in FIG. 5, example package 500 includes a first semiconductor chip 302, a second semiconductor chip 304, and a substrate 502, all sealed by a molding compound or encapsulate 208 (e.g., an epoxy mold compound (EMC)), so as to present a single integrated package to the outside world.

Semiconductor chips 302 and 304 are both interconnected to substrate 502. In an embodiment, as shown in FIG. 5, chips 302 and 304 are flip-chips and are interconnected to a first surface of substrate 502 via a plurality of respective solder/stud bumps 212, deposited on respective chip pads (not shown in FIG. 5) of chips 302 and 304. Alternatively, one or more of chips 302 and 304 are interconnected to the first surface of substrate 502 via respective wire bonds or similar connections.

Substrate 502 includes a second surface upon which a plurality of solder balls (e.g., ball grid array (BGA) balls) 210 may be attached. Solder balls 210 serve as external connection terminals.

In an embodiment, substrate 502 is a reconstitution substrate from a reconstitution panel or strip. Substrate 502 can be made of, for example and without limitation, flex tape material, ceramic material, organic laminate material, resin-based material, or other similar materials. According to embodiments, substrate 502 is selected based on performance requirements of chips 302 and 304 and/or cost requirements of package 500.

Figure 6:
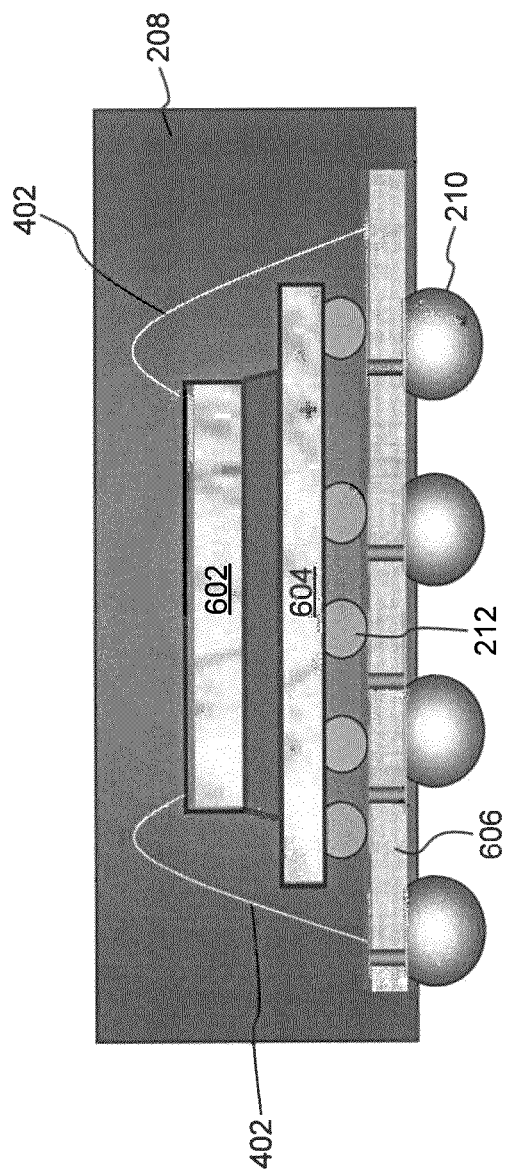
FIG. 6 illustrates a cross-sectional view of an example package according to an embodiment of the present invention.

FIG. 6 illustrates a cross-sectional view of another example package 600 according to an embodiment of the present invention. Example package 600 may be a hybrid fine-pitch ball grid array (FBGA) package.

As shown in FIG. 6, example package 600 includes a first semiconductor chip 602, a second semiconductor chip 604, and a substrate 606, all sealed by a molding compound or encapsulate 208 (e.g., an epoxy mold compound (EMC)), so as to present a single integrated package to the outside world.

In an embodiment, as shown in FIG. 6, chips 602 and 604 are vertically stacked in package 600. This stacking approach significantly increases the amount of chip area that can be housed in package 600. In an embodiment, stacking is done in a pyramid style, with chip 602 having a smaller size than chip 604. Embodiments, however, are not limited as such, and chip 602 may have equal or larger size than chip 604. A spacer (e.g., dummy layer of semiconductor material) may be placed between chips 602 and 604.

Semiconductor chips 602 and 604 are both interconnected to substrate 606. In an embodiment, as shown in FIG. 6, chip 604 is a flip-chip and is interconnected to a first surface of substrate 606 via a plurality of solder/stud bumps 212, deposited on respective chip pads (not shown in FIG. 6) of chip 606. Chip 602, which is mounted on top of chip 604 (directly or with the spacer in between), is then interconnected to the first surface of substrate 606 via wire bonds 402 or similar connections.

A plurality of solder balls (e.g., ball grid array (BGA) balls) 210 may be attached onto a second surface of substrate 606. Solder balls 210 serve as external connection terminals.

In an embodiment, substrate 606 is a reconstitution substrate from a reconstitution panel or strip. Substrate 606 can be made of, for example and without limitation, flex tape material, ceramic material, organic laminate material, resin-based material, or other similar materials. According to embodiments, substrate 606 is selected based on performance requirements of chips 602 and 604 and/or cost requirements of package 600.

In other embodiments, substrate 606 can be replaced with multiple reconstitution substrates of same or different material types, sizes and/or layer counts (as described above in FIGS. 2-4). Chips 602 and 604 can be interconnected to same or different ones of the multiple reconstitution substrates.

Figure 7:
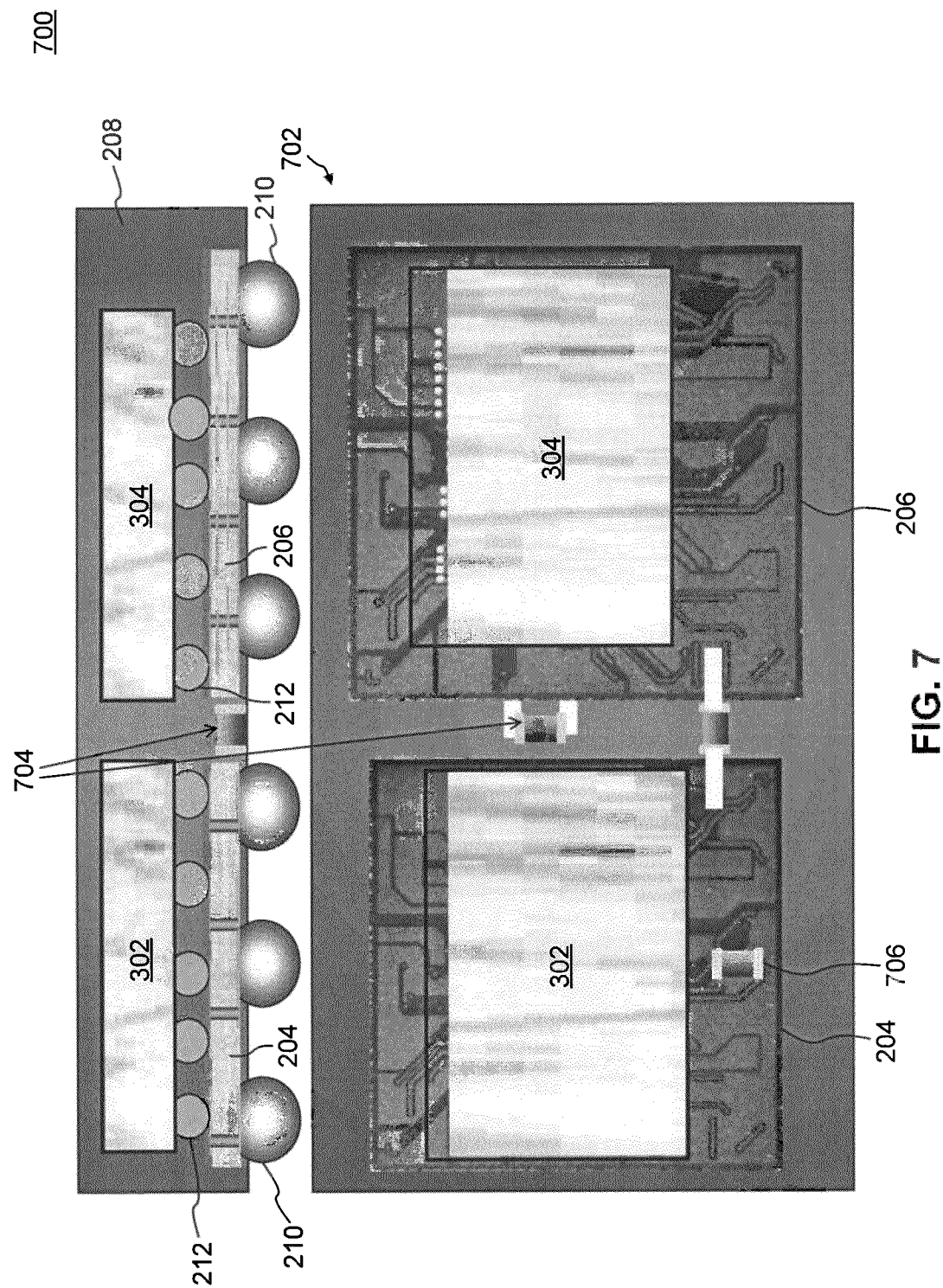
FIG. 7 illustrates a cross-sectional view and a top view of an example package according to an embodiment of the present invention.

FIG. 7 illustrates a cross-sectional view of an example package 700 according to an embodiment of the present invention. A top view 702 of example package 700 is also shown in FIG. 7. Example package 700 may be a fine-pitch ball grid array (FBGA) package.

Example package 700 is similar to example package 300 described above in FIG. 3. As such, as shown in FIG. 7, example package 700 includes a first semiconductor chip 302, a second semiconductor chip 304, a first substrate 204, and a second substrate 206, all sealed by a molding compound or encapsulate 208 (e.g., an epoxy mold compound (EMC)), so as to present a single integrated package to the outside world. Semiconductor chips 302 and 304 are interconnected respectively to first substrate 204 and second substrate 206. In an embodiment, chips 302 and 304 are flip-chips and are interconnected, respectively, to a first surface of first substrate 204 and a first surface of second substrate 206 via a plurality of respective solder/stud bumps 212, deposited on respective chip pads (not shown in FIG. 3) of chips 302 and 304. Alternatively, chips 302 and 304 are interconnected, respectively, to the first surface of first substrate 204 and the first surface of second substrate 206 via respective wire bonds or similar connections.

Figure 8:
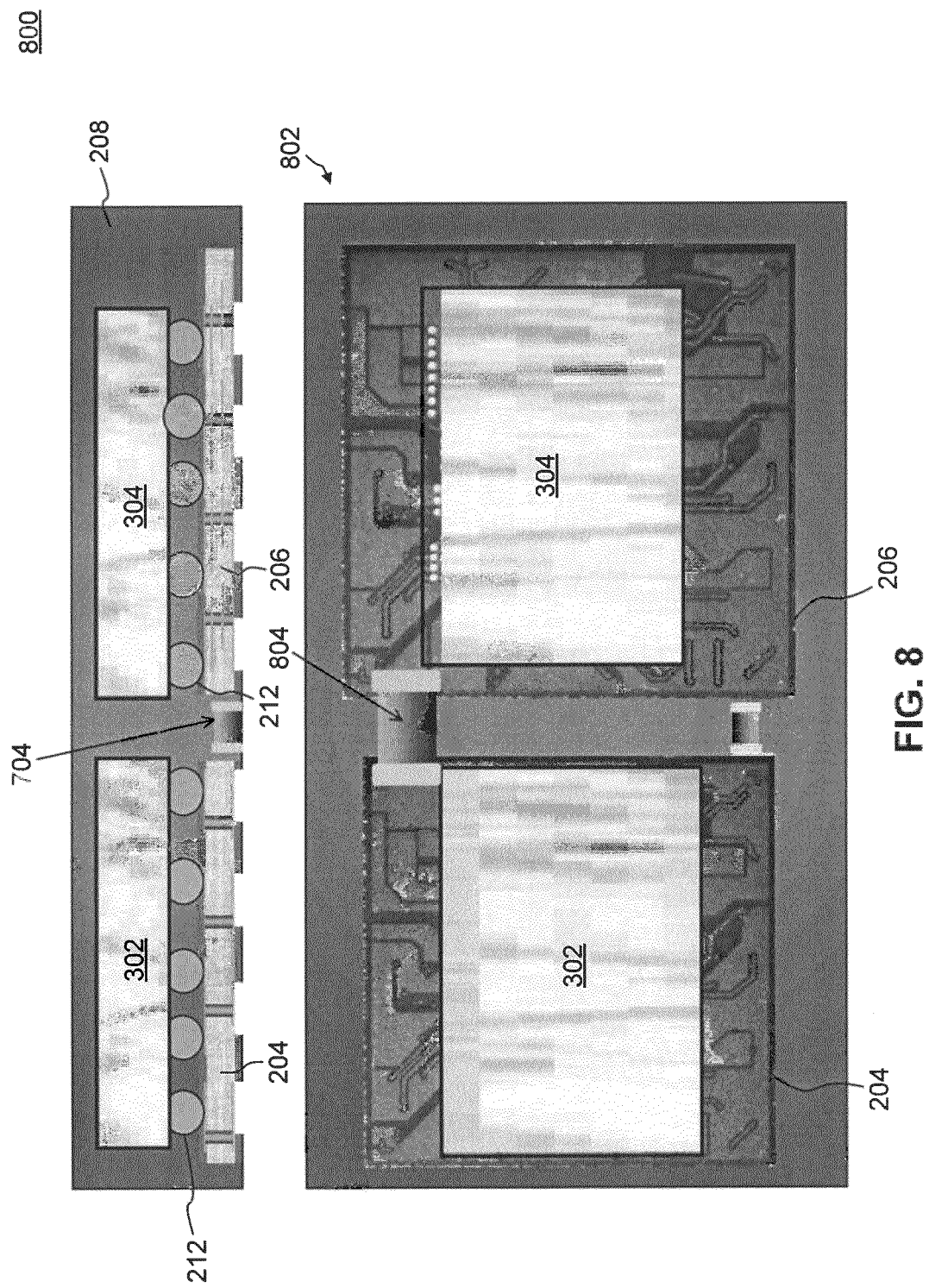
FIG. 8 illustrates a cross-sectional view and a top view of an example package according to an embodiment of the present invention.

In addition, example package 700 includes passive components, such as passive components 704 and 706. Passive components may include, for example, resistors, capacitors, and inductors. According to embodiments, passive components can be directly mounted on reconstitution substrates (such as passive component 706, which is directly mounted on substrate 204) or placed in between reconstitution substrates (such as passive component 704, which is placed between substrates 204 and 206). Typically, passive components are used to build modules comprising multiple chips and/or reconstitution substrates. Substrate 204 and substrate 206 can be connected with each other through wirebonds or similar interconnections FIG. 8 illustrates a cross-sectional view of another example package 800 according to an embodiment of the present invention. A top view 802 of example package 800 is also shown in FIG. 8. Example package 800 is similar to example package 700 described above in FIG. 7. In addition, example package 800 includes passive components 804 that are embedded between substrates 204 and 206 and also surface mounted at each end to substrates 204 and 206. This approach allows an increase in space utilization as substrates 204 and 206 can be placed closer to each other. In an embodiment, example package 800 is a LGA package. As such, passive components 704 in package 800 can be connected to an external PCB, if necessary.

FIG. 9 illustrates a process 900 for fabricating an example package according to an embodiment of the present invention. Process 900 can be used to fabricate package 200 described above in FIG. 2, for example. As shown in FIG. 9, process 900 includes steps 902, 904, 906, 908, 910, and 912.

In step 902, a tape carrier 914 (which may be on any known type of material) is provided and is laminated with an adhesive tape 916. Tape carrier 914 can have different shapes and can be of different material types. Adhesive tape 916 can be a thermal tape, a UV tape, or other similar tape. Further, adhesive tape 916 can be a single-sided or a double-sided adhesive tape.

In step 904, a plurality of reconstitution substrates 918, 920, 922, and 924 are formed on adhesive tape 916. In an embodiment, each of substrates 918, 920, 922, and 924 is placed on tape 916 individually. Alternatively, substrates 918, 920, 922, and 924 form part of a reconstitution substrate panel or strip, and are thus placed on tape 916 simultaneously together. Substrates 918, 920, 922, and 924 may be of same or different material types, and may have same or different layer counts and same or different size. In an embodiment, substrates 918 and 922 are identical, and substrates 920 and 924 are identical.

In step 906, semiconductor chips 926 and 928 are attached to substrates 918, 920, 922, and 924 through respective pluralities of solder/stud/copper pillar bumps 930. In particular, as shown in FIG. 9, chip 926 is interconnected to substrates 918 and 920, and chip 928 is interconnected to substrates 922 and 924. Chips 926 and 928 may be identical semiconductor chips.

In step 908, a molding compound or encapsulate 932 (e.g., an epoxy mold compound (EMC)) is applied to seal substrates 918, 920, 922, and 924 and semiconductor chips 926 and 928. Then, in step 910, tape carrier 914 and tape 916 are removed.

Finally, in step 912, a respective plurality of solder balls (e.g., ball grid array (BGA) balls) 934 are attached to each of substrates 918, 920, 922, and 924, and individual packages are singulated.

As would be understood by a person of skill in the art based on the teachings herein, variations to process 900 may exist. For example, in another embodiment, step 906 of process 900 is performed before step 904, so that chips 926 and 928 are attached to substrates 918, 920, 922, and 924, before substrates 918, 920, 922, and 924 are formed on adhesive tape 916.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A package, comprising:
    a first substrate characterized by a first material type and a first layer count;
    a second substrate characterized by a second material type and a second layer count; and
    a first semiconductor chip having a first portion and a second portion, the first semiconductor chip being interconnected to both the first substrate and the second substrate,
    wherein the first portion of the first semiconductor chip is interconnected to the first substrate, and the second portion of the first semiconductor chip is interconnected to the second substrate, and wherein at least one of the first material type and the first layer count of the first substrate is selected according to characteristics of the first portion of the first semiconductor chip, and at least one of the second material type and the second layer count of the second substrate is selected according to characteristics of the second portion of the first semiconductor chip.

2. The package of claim 1, wherein the first material type and the second material type are the same.

3. The package of claim 1, wherein the first material type and the second material type are different.

4. The package of claim 1, wherein the first layer count and the second layer count are equal.

5. The package of claim 1, wherein the first layer count and the second layer count are different.

6. The package of claim 1, wherein the first semiconductor chip is interconnected to the first substrate and the second substrate via respective solder bumps.

7. The package of claim 1, wherein the first semiconductor chip is interconnected to the first substrate and the second substrate via respective wire bonds.

8. The package of claim 1,
wherein the characteristics of the first portion or the second portion of the first semiconductor chip include one or more of signal integrity requirements, operation power requirements, and heat dissipation requirements of the first portion or the second the first semiconductor chip.

9. The package of claim 1, further comprising:
a circuit block implemented on the first portion of the first semiconductor chip, wherein at least one of the first material type and the first layer count is selected according to the circuit block.

10. The package of claim 1, wherein at least one of the first material type and the first layer count is selected according to signal integrity requirements of the first portion of the first semiconductor chip.

11. The package of claim 1, wherein at least one of the first material type and the first layer count is selected according to operating power requirements of the first portion of the first semiconductor chip.

12. The package of claim 1, wherein at least one of the first material type and the first layer count is selected according to heat dissipation requirements of the first portion of the first semiconductor chip.

13. The package of claim 1, further comprising:
a second semiconductor chip having a first portion and a second portion, wherein the first portion of the second semiconductor chip is interconnected to the first substrate, and the second portion of the second semiconductor chip is interconnected to the second substrate.

14. The package of claim 13, wherein the first semiconductor chip and the second semiconductor chip are vertically stacked within the package.

15. The package of claim 13, wherein the first semiconductor chip is interconnected to the first substrate and the second substrate via respective solder bumps, and wherein the second semiconductor chip is interconnected to the first substrate and the second substrate via respective wire bonds.

16. The package of claim 1, wherein the package is a fine-pitch ball grid array (FBGA) package.

17. A package, comprising:
a first substrate characterized by a first material type and a first layer count;
a second substrate characterized by a second material type and a second layer count, wherein the first material type is different than the second material type or the first layer count is different than the second layer count; and
a semiconductor chip having a first portion and a second portion, wherein the first portion of the semiconductor chip is interconnected to the first substrate, and the second portion of the semiconductor chip is interconnected to the second substrate.

18. The package of claim 17, wherein at least one of the first material type and the first layer count of the first substrate is selected according to characteristics of the first portion of the semiconductor chip, and at least one of the second material type and the second layer count of the second substrate is selected according to characteristics of the second portion of the semiconductor chip.

19. The package of claim 17, further comprising:
a circuit block implemented on the first portion of the semiconductor chip, wherein at least one of the first material type and the first layer count is selected based on the circuit block.

20. The package of claim 19, wherein at least one of the first material type and the first layer count is selected according to one or more of: a signal integrity requirement, an operating power requirement, and a heat dissipation requirement of the circuit block.

* * * * *

UNITED STATES PATENT AND TRADEMARK OFFICE
CERTIFICATE OF CORRECTION

PATENT NO.        : 8,587,123 B2
APPLICATION NO.   : 13/246465
DATED             : November 19, 2013
INVENTOR(S)       : Law et al.

It is certified that error appears in the above-identified patent and that said Letters Patent is hereby corrected as shown below:

In the title page, Item (57) Abstract, "from a reconstitution. substrate" should be replaced with --from a reconstitution substrate--.

In the Claims

Column 9, line 26, Claim 8, "more of signal integrity" should be replaced with --more of: signal integrity--.

Column 9, line 28, Claim 8, "the second the first" should be replaced with --the second portion of the first--.

Signed and Sealed this
Twenty-fifth Day of February, 2014

Michelle K. Lee
*Deputy Director of the United States Patent and Trademark Office*